US009929032B2

(12) United States Patent
Gregerson (10) Patent No.: US 9,929,032 B2
(45) Date of Patent: Mar. 27, 2018

(54) FRONT OPENING WAFER CONTAINER WITH ROBOTIC FLANGE

(71) Applicant: ENTEGRIS, INC., Billerica, MA (US)

(72) Inventor: Barry Gregerson, Deephaven, MN (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 15/145,674

(22) Filed: May 3, 2016

(65) Prior Publication Data

US 2016/0358798 A1    Dec. 8, 2016

Related U.S. Application Data (63) Continuation of application No. 13/880,710, filed as application No. PCT/US2011/056915 on Oct. 19, 2011, now abandoned.

(60) Provisional application No. 61/394,751, filed on Oct. 19, 2010.

(51) Int. Cl.
*H01L 21/673* (2006.01)
*H01L 21/677* (2006.01)

(52) U.S. Cl.
CPC ...... *H01L 21/67379* (2013.01); *H01L 21/673* (2013.01); *H01L 21/67386* (2013.01); *H01L 21/67766* (2013.01)

(58) Field of Classification Search
CPC ............. H01L 21/673; H01L 21/67386; H01L 21/67379
USPC ........................................ 206/454, 710, 832
See application file for complete search history.

(56) References Cited

U.S. PATENT DOCUMENTS

| | | | |
|---|---|---|---|
| 6,010,008 A | 1/2000 | Nyseth et al. | |
| 6,186,331 B1 | 2/2001 | Kinpara et al. | |
| 6,382,419 B1 * | 5/2002 | Fujimori | H01L 21/67369 |
| | | | 206/454 |
| 6,398,033 B1 | 6/2002 | Wu et al. | |
| 6,848,578 B2 | 2/2005 | Eggum | |
| 7,048,127 B2 | 5/2006 | Hyobu et al. | |
| 7,347,329 B2 | 3/2008 | Burns et al. | |
| 7,380,668 B2 | 6/2008 | CletusWittman | |
| 7,383,955 B2 | 6/2008 | Matsutori et al. | |

(Continued)

FOREIGN PATENT DOCUMENTS

| | | |
|---|---|---|
| CN | 1615248 A | 5/2005 |
| CN | 101048852 A | 10/2007 |

(Continued)

*Primary Examiner* — King M Chu (57) ABSTRACT

A front opening wafer container suitable, for large diameter wafers, 300 mm and above, utilizes a removable robotic flange that attaches vertically, without separate fasteners, using detents having resilient bending members that extend vertically to attach to an upwardly extending flange on the top wall of the container portion. A multiplicity of upwardly and outwardly extending strengthening ribs extend upwardly from the top wall of the container portion and extend along the top wall toward the left and right sides and the back side of the container portion, ad each of all four sides of the attachment flange. A further locking piece or core may be inserted and retained at the neck of the robotic flange to lock the resilient deflectable portions in their retention position. The locking piece further may be secured in place with a detent mechanism formed by part of the core and flanges.

19 Claims, 8 Drawing Sheets

(56) References Cited

U.S. PATENT DOCUMENTS

| | | |
|---|---|---|
| 7,520,388 B2 * | 4/2009 | Matsutori ......... H01L 21/67373 206/454 |
| 7,703,609 B2 | 4/2010 | Nakatogawa |
| D668,865 S | 10/2012 | Gregerson |
| D689,696 S | 9/2013 | Gregerson |
| 2001/0040116 A1 | 11/2001 | Hyobu et al. |
| 2002/0125170 A1 | 9/2002 | Nyseth et al. |
| 2003/0010657 A1 | 1/2003 | Zabka et al. |
| 2004/0099569 A1 | 5/2004 | Matsutori et al. |
| 2004/0126220 A1 | 7/2004 | Howell et al. |
| 2006/0032786 A1 | 2/2006 | Wu et al. |
| 2006/0244942 A1 | 11/2006 | Gregerson et al. |
| 2006/0260978 A1 | 11/2006 | Gregerson et al. |
| 2007/0170089 A1 | 7/2007 | Burns et al. |
| 2008/0251415 A1 | 10/2008 | Yamagishi et al. |
| 2009/0206001 A1 | 8/2009 | Sasaki et al. |
| 2009/0277816 A1 | 11/2009 | Aramaki |
| 2011/0005966 A1 | 1/2011 | Chiu et al. |
| 2011/0049006 A1 | 3/2011 | Pylant et al. |
| 2013/0270152 A1 | 10/2013 | Gregerson |

FOREIGN PATENT DOCUMENTS

| | | |
|---|---|---|
| CN | 101460378 A | 6/2009 |
| JP | 2000-306988 A | 11/2000 |
| JP | 2004-214269 A | 7/2004 |
| JP | 2006-100837 A | 4/2006 |
| JP | 2006-128461 A | 5/2006 |
| TW | 1239932 B | 9/2005 |
| WO | 2006/044021 A1 | 4/2006 |
| WO | 2007/132711 A1 | 11/2007 |
| WO | 2009/089552 A2 | 7/2009 |
| WO | 2012/054625 A2 | 4/2012 |

* cited by examiner

FRONT OPENING WAFER CONTAINER WITH ROBOTIC FLANGE

CROSS REFERENCE TO RELATED APPLICATIONS

The present application is a continuation of U.S. patent application Ser. No. 13/880,710, filed Jul. 1, 2013, which is a § 371 of International Patent Application No. PCT/US2011/056915, filed Oct. 19, 2011, which claims the benefit of U.S. Provisional Application No. 61/394,751, filed Oct. 19, 2010, all of which are hereby incorporated by reference herein in their entireties.

BACKGROUND OF THE INVENTION

Integrated circuits such as computer chips are manufactured from silicon wafers. The silicon wafers need to be maintained in extremely clean and contamination free environments during their transport and in between manufacturing process steps. Additional, required or desirable characteristics of containers to transport and/or store semiconductor wafers include light weight, rigidity, cleanliness, limited gaseous emissions, and cost effective manufacturability. The containers provide hermetic or close to hermetic isolation of wafers when the containers are closed. Simply stated, such containers need to keep the wafers clean, uncontaminated, and undamaged.

Plastic containers have been used for decades for transporting and storing wafers in-between process steps. Selected polymer materials provide adequate characteristics. Such containers have highly controlled tolerances for interfacing with processing equipment as well as the equipment/robots that transport the containers. Moreover, it is desirable in such plastic containers to utilize components that are attachable and removable without using metallic fasteners such as screws. Metal fasteners cause particle generation when inserted and removed.

Driven by cost efficiencies and improved manufacturing capabilities, the size of wafers utilized in manufacturing semiconductors has been increasing. Now several fabrication facilities utilize 300 mm wafers. As the size of wafers has increased and the density of the circuits has increased making the circuits susceptible to smaller and smaller particles and other contaminants. Thus, as the wafers have increased in size, the containers have increased in size as well; the requirements of keeping the wafers clean and contaminant free have become more stringent due to the wafers being more susceptible to smaller particles and other contaminants, containers have increased in size. Additionally, carriers need to maintain their capabilities under the rigors of robotic handling which includes lifting the carrier by the robotic flange positioned at the top of the container.

Front opening wafer containers have become the industry standard for transporting and storing large diameter 300 mm wafers.

In such wafer containers the front door is latchable to a container portion and closes a front access opening through which the wafers are robotically inserted and removed. When the container is fully loaded with wafers the door is inserted into the door frame of the container portion and latched thereto. When seated the cushions on the door then provide upward, downward, and inward constraint.

A problem discovered in fabricating front opening plastic containers for holding and/or transporting larger wafers, for example 300 mm containers, is that the expanses of plastic utilized on the top, bottom, sides, front, and back of the container may flex due to the increased weight of the wafer load. Particularly, when the container is picked up by the robotic flange affixed to the top of the container. The flexing can compromise the sealing of the door to door frame by distorting the shape of the door frame, essentially elongating it in the vertical direction. Also, the flexing can affect the container to wafer engagement, more particularly, the constraints that the wafer supports provide to the wafers is altered.

It is conventional wisdom in 300 mm wafer containers to avoid using metal in any fashion. Interlocking flanges with are used for attachment of accessories such as robotic flanges and side handles. Plastic leaf springs that are part of the engaging components and that form detents are utilized to retain the components, such as robotic flanges in place. See U.S. Pat. No. 6,010,008, owned by the owner of this application, and incorporated herein by reference. Such robotic flanges extend in the z direction utilizing flanges extending also in the z direction. The detents operate only to maintain the cooperating structures and stay properly positioned on the flanges without carrying any appreciable loading through the detent structures, for example the resiliently bendable portion of such detents extend in the z direction and bend about an axis in the x direction. Thus, the direct loading on the robotic flange to container portion connection is primarily in the y direction and is carried through the horizontally extending flanges. When such containers are fully loaded and robotically supported by the robotic flange, stress analysis studies confirms that the primary stresses are found on the top and sides adjacent the flanges as opposed to the back side and front side. From a structural perspective, it would be preferable to better distribute the load carrying forces more uniformly on the back of the carrier portion to minimize deflection issues.

This problem has been addressed to some extent by utilizing robotic flanges that effectively saddle the container portion and extend down the sides of the containers such that the load of the wafers is not transferred totally through the side walls of the carrier, see U.S. Pat. No. 7,347,329 assigned to the owner of the instant application and incorporated herein by reference.

The semiconductor industry is now moving toward utilizing larger, 450 mm diameter wafers. The larger diameter wafers, although providing cost efficiencies, also provide increased fragility, greater weight, and present undiscovered issues associated with handling and storing the larger wafers in containers made of plastic. The flexing and corresponding problems associated with the expanses of plastic on the top, bottom, sides, front, and back are exacerbated.

With the significant leaps in the size of processed wafers, new issues and problems arise that were not present with smaller sized wafers. Many standards for 450 mm wafers, such as the number of wafers in containers and the spacing between wafers, may very well remain the same as 300 mm wafer container standards due to existing equipment compatibilities and cost pressures. And, of course, as wafers get larger in diameter, they correspondingly get heavier. A wafer container that holds the same number of 450 mm wafers as is provided in standardized 300 mm containers is expected to weigh approximately 40 pounds. At this weight, manual handling starts to become more difficult.

Using comparable thicknesses of polymer walls for a larger container may not provide sufficient structural rigidity of the container. That is, the container would be expected to be less dimensionally stable under loading, transfer and shipping due to the greater dimensions and greater expanses of polymer. Thickening the walls and adding significant strengthening structure would further increase the weight of 450 mm wafer containers.

Moreover, conventional 300 mm wafer containers are typically injection molded. It is anticipated that it will be difficult to adequately control the dimensions of larger containers utilizing comparable injection molding practices and comparable or larger wall thicknesses. Currently 300 mm wafer containers generally utilize the shell as the principal structural member for positioning components that interface with wafers and outside equipment, namely the wafer supports and the kinematic coupling machine interface.

In addition, the open interior volume will significantly increase as will the area of the open front that sealingly receives the door. This suggests more difficult sealing issues between the door and the container portion.

Wafers of larger dimensions will also have significantly greater sag which will make them more susceptible to damage during handling and transport and require unique support not required for smaller wafers. This greater sag presents challenges in maintaining the desired spacing between wafers while still allowing placement and removal of the wafers robotically by robotic arms.

Accordingly, it would be desirable to develop front opening configurations for 450 mm wafer containers that have design attributes for minimizing wafer sag and minimizing weight of the container. In addition, configurations providing improved sealing characteristics for the doors would be desirable. Moreover, configurations providing enhanced wafer support to accommodate storing of 450 mm wafers in wafer containers as well during robotic handling of the wafers would be desirable.

SUMMARY OF THE INVENTION

In an embodiment of the invention, a front opening wafer container suitable, for large diameter wafers, 300 mm and above, utilizes a removable robotic flange that attaches vertically, without separate fasteners, using detents having resilient bending members that extend vertically to attach to an upwardly extending flange on the top wall of the container portion. In embodiments of the invention, a multiplicity of upwardly and outwardly extending strengthening ribs extend upwardly from the top wall of the container portion and extend along the top wall toward the left and right sides and the back side of the container portion, at each of all four sides of the attachment flange. In embodiments of the invention, the flange on the top wall has four sides, a front, a back, a left side, and a right side with each side having at least one a detent mechanism that actuates to capture the robotic flange with a downward placement of the neck of the robotic flange to engage the upwardly extending flange and to deflect resilient deflectable portions of the detent mechanisms horizontally from a retention position to a deflected position where the lifting flange may be installed and removed. In embodiments of the invention, a further locking piece may be inserted and retained at the neck of the robotic flange to lock the resilient deflectable portions in their retention position. In embodiments of the invention, a multiplicity of upwardly and outwardly extending strengthening ribs extend from the top wall of the container portion adjacent to each of all four sides of the attachment flange. The ribs may be aligned normally to each side of the attachment flange and may continue to extend from the top side down the walls to or towards the bottom of the container portion.

It has been discovered through stress analysis that the deflection caused by the loading on the sides of the robotic attachment flange, as opposed to the back side can cause a significant inward outward deflection of the back wall of the wafer container. This deflection can be reduced by more than 75% by utilizing the back side of the attachment flange to share the load when the container is lifted by the robotic flange. Thus, a feature and advantage of the invention is a container portion where the deflection of the back wall is minimized by a robotic lifting flange that is structurally connected to the attachment flange at the front, back, and sides of the attachment flange such that weight of the container is shared by all four sides of the attachment flange.

Some embodiments include a front opening wafer container for large 450 mm diameter wafers. The wafer container including a container portion having a top wall, bottom wall, right side wall, left side wall, rear wall and door frame defining a front opening. The wafer container also including an upwardly extending flange on the top wall having a plurality of sides in a rectangular shape as well as an attachment flange operably attached to an upwardly extending flange. Further the wafer container has a multiplicity of upwardly and outwardly extending strengthening ribs that extend upwardly from the top wall of the container portion and extend along the top wall toward the left and right side walls and the back side wall of the container portion from the sides of the upwardly extending flange.

In other embodiments, a front opening wafer container for large diameter wafers, is disclosed. In these embodiments, the wafer contain includes a container portion having a top wall, a pair of sidewalls, a back wall, bottom wall and a door frame defining a front opening. The container also has an upwardly extending flange on the top wall of the container portion and a removable robotic flange that attaches vertically, without separate fasteners, using detents having resilient bending members that extend vertically to attach to the upwardly extending flange on the top wall of the container portion.

Other embodiments are directed to a front opening wafer container for large diameter wafers including a container portion, an attachment flange, and a multiplicity of strengthening ribs. The container portion having a top wall, bottom wall, right side wall, left side wall, rear wall and front opening. The attachment flange with four sides, operably attached to the top wall. Finally, the multiplicity of ribs include a multiplicity of upwardly and outwardly extending strengthening ribs extending from the top wall of the container portion adjacent to each of the four sides of the attachment flange, the ribs aligned normally to each of the four sides of the attachment flange and further extend from the top side down the right and left side walls towards the bottom of the container portion.

In yet other embodiments, the invention includes a robotic flange including a frame portion adapted to engage in vertical attachment to a top port on the top of a substrate container with a plurality of vertically-disposed cantilevered snaps and further contains a plurality of flexible spring members in its interior and an internal portion that includes detents that engage with the flexible spring members on the interior of the frame portion to secure the internal portion into place.

An embodiment of the invention further includes a method of attaching a robotic flange. The method includes providing a frame portion adapted to engage in vertical attachment to the top of a substrate container. It further includes lowering the frame portion vertically into place within a port on the top of the substrate container, snapping into place the frame portion with detents, and securing an interlocking core piece within the frame portion.

Other embodiments include a front opening wafer container for large diameter wafers. Such containers include a container portion, an attachment flange and a supplemental distortion minimization structure. Specifically, the container portion generally includes a top wall, a bottom wall, a right side wall, a left side wall, and a rear wall. The attachment flange is operably attached to the top wall and the supplemental distortion minimization structure is at least partially surrounding container for minimizing wafer container distortion under loading conditions.

It is a feature and advantage of embodiments of the invention that the robotic flange is attached without separate fasteners such as screws or the like.

It is a feature and advantage of embodiments of the invention that the attachment of the flange by way of detent mechanisms on all four sides are locked in with a single interlocking core.

It is a feature and advantage of embodiments of the invention that the loading through the robotic flange assembly when lifted by the robotic flange is more evenly distributed to the back wall of the wafer container which minimizes the deflection of the back wall and thereby provides more secure wafer constraint during such transport.

It is a feature and advantage of embodiments of the invention that the leaf springs extend vertically, in the same direction as the load carrying direction, allowing additional structural ribbing rearwardly of the attachment flange. Where the robotic flange slides on horizontally as in prior art wafer containers, such ribs are precluded or substantially precluded. The additional structural ribbing facilitates the load spreading more evenly between the sides and the back.

It is noted that certain aspects of the invention herein, namely the robotic flange features and components, may be utilized for other substrates containers beyond 450 mm wafers and 300 mm wafers.

DETAILED DESCRIPTION

Referring to the figures, a front opening wafer container 20 is illustrated and comprises generally a container portion 22, having a top wall 23, a pair of right and left side walls 24, 25, a back wall 26, a bottom wall 27, a door frame 28 defining a front opening 29, and a front door 30 configured to close the open front. The door has a pair of key holes 36, 38 that access latch mechanisms 42 located inside the door housing 44. The door has an outside surface 50, a periphery 54, and an inside surface 56. Slots 60 are positioned on the periphery and allow latching tabs 64 or tips to extend and retract from the door to engage and disengage recesses 70 on the inside surface of the door frame. A seal or gasket 72 follows the circumference of the door and engages with the door frame to sealingly close the door when the latches are actuated.

An automation or robotic flange assembly 76 is positioned on the top side 78 of the container portion. The robotic flange or attachment flange 150 is generally comprised of a frame portion 152 and an interlocking core 120. The robotic flange 150 attaches vertically into a receiver 77 configured as a socket 80 defined by a vertically upwardly extending flange 81 formed of ribbing 82, including at least four sides 99, laid out in a rectangular shape. The upwardly extending flange 81 and ribbing integral with and extending from the top wall 23 has apertures 84 for receiving catch nubs or hooks 86 on leaf springs 88, configured as downwardly extending cantilevered snaps 89, that extend downwardly from a base 90 of the flange. The leaf springs and hooks together with the cooperating rib with opening constitute a detent mechanism 91. The flange base has four sides 92, 93, 94, 95 each with two of the cantilevered snaps. Robotic lifting shelves 98 extend outwardly at all four sides of the base for engagement by a lifting robot. Notably the leaf springs extend vertically, in the same direction as the load carrying direction and they flex or resiliently bend horizontally, to engage and disengage from the receiver.

Figure 1:
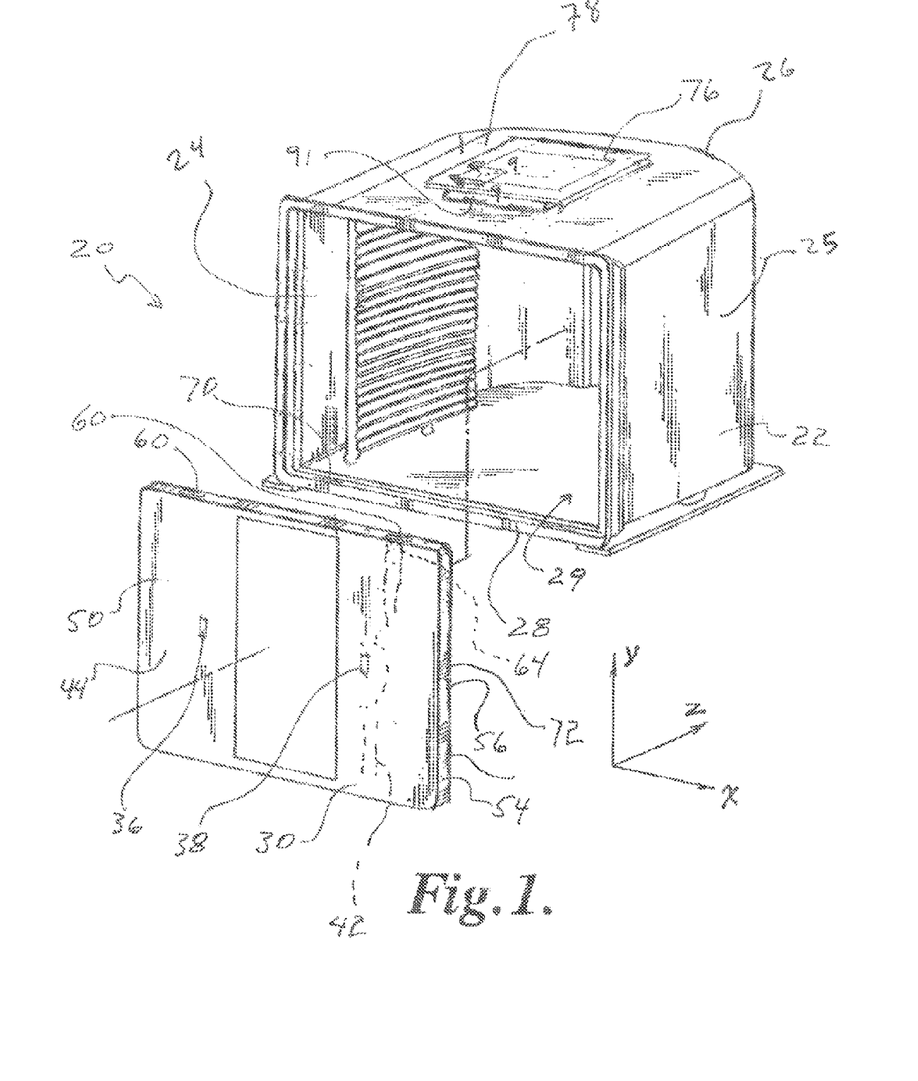
FIG. 1 is a perspective of a front opening wafer container according to the invention.
Figure 2:
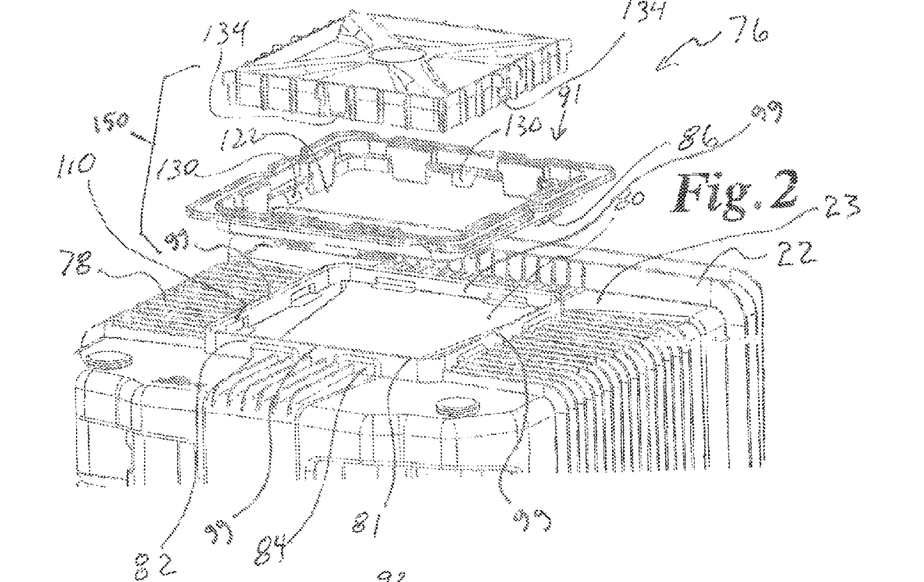
FIG. 2 is an exploded view of the top of a front opening wafer container and a robotic flange assembly according to the invention herein.
Figures 3, 4:
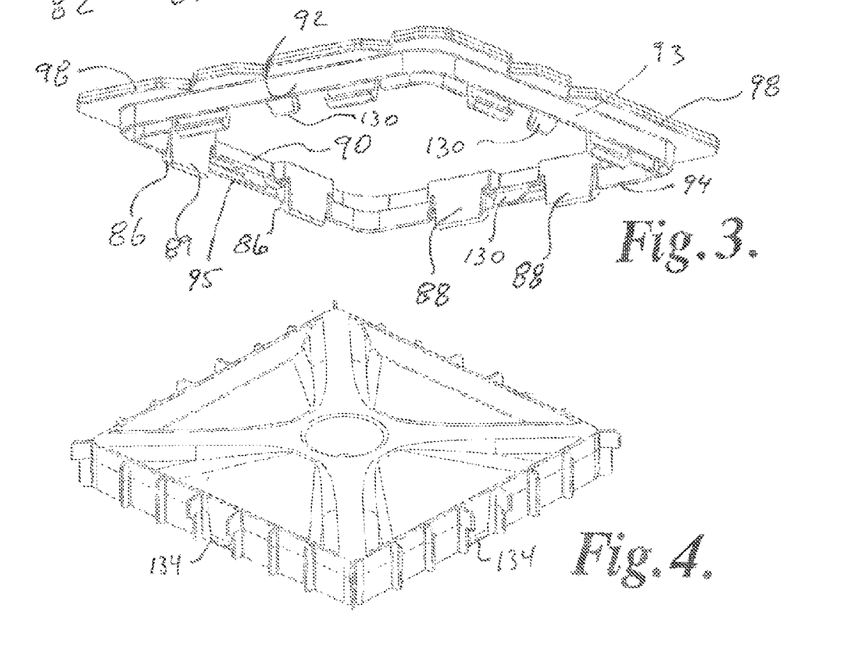
FIG. 3 is a perspective view of an automation flange according to the invention herein.
FIG. 4 is a perspective view of an interlocking core according to the invention herein.
Figure 5:
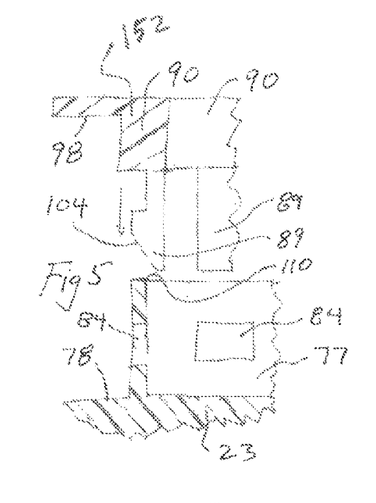
FIG. 5 is a cross sectional illustrating assembly steps of a robotic flange according to the invention herein.
Figure 6:
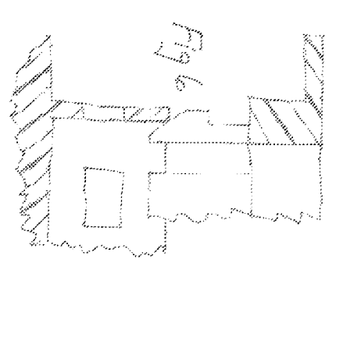
FIG. 6 is a cross sectional illustrating assembly associated with FIG. 5.
Figure 7:
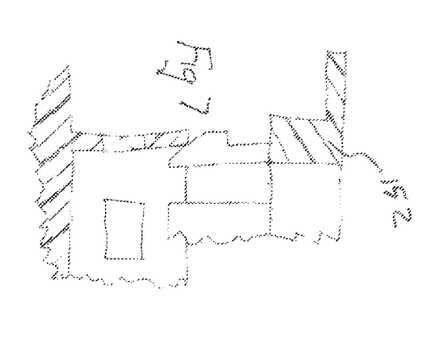
FIG. 7 is a cross sectional illustrating assembly associated with FIGS. 5 and 6.
Figure 8:
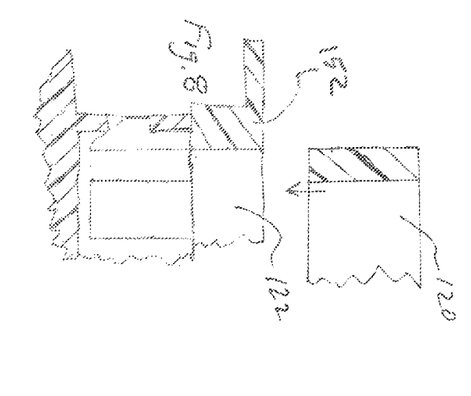
FIG. 8 is a cross sectional illustrating assembly associated with FIGS. 5, 6, and 7
Figure 9:
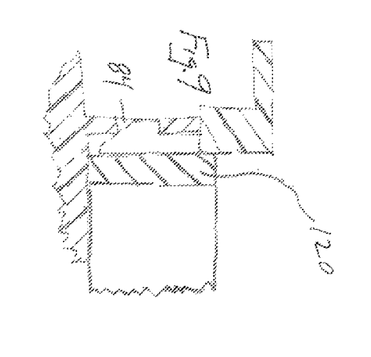
FIG. 9 is a cross sectional illustrating assembly associated with FIGS. 5-8 and taken at line 9-9 of FIG. 1.

Referring to FIGS. 5-9, wedge shaped surfaces 104, that provides a taper on the end of the leaf springs allow the flange to be inserted with one single motion. The frame portion 152 of the flange 150 is placed within the receiver 77 or port 156, is pushed downward to deflect the leaf springs inwardly, see FIG. 7, as the tapered surfaces engage the engagement surfaces 110 on the receiver. When the nubs then reach the apertures or recesses, see FIG. 8, they snap into said apertures or recesses. The interlocking core 120 then is pushed into the recess defined by the interior 122 of the frame portion of the flange to secure the nubs in the apertures. Notably, referring to FIG. 2, the flange has a four spring members 130 that deflect outward by engagement with the catches 134 of the core as the core is being pushed down and then snap over the top of the catches to secure the core in place.

The components may generally be injected molded from polymers typically used for semiconductor wafers. For example, polycarbonates, fluoropolymers, polyetheretherketone.

Figure 10:
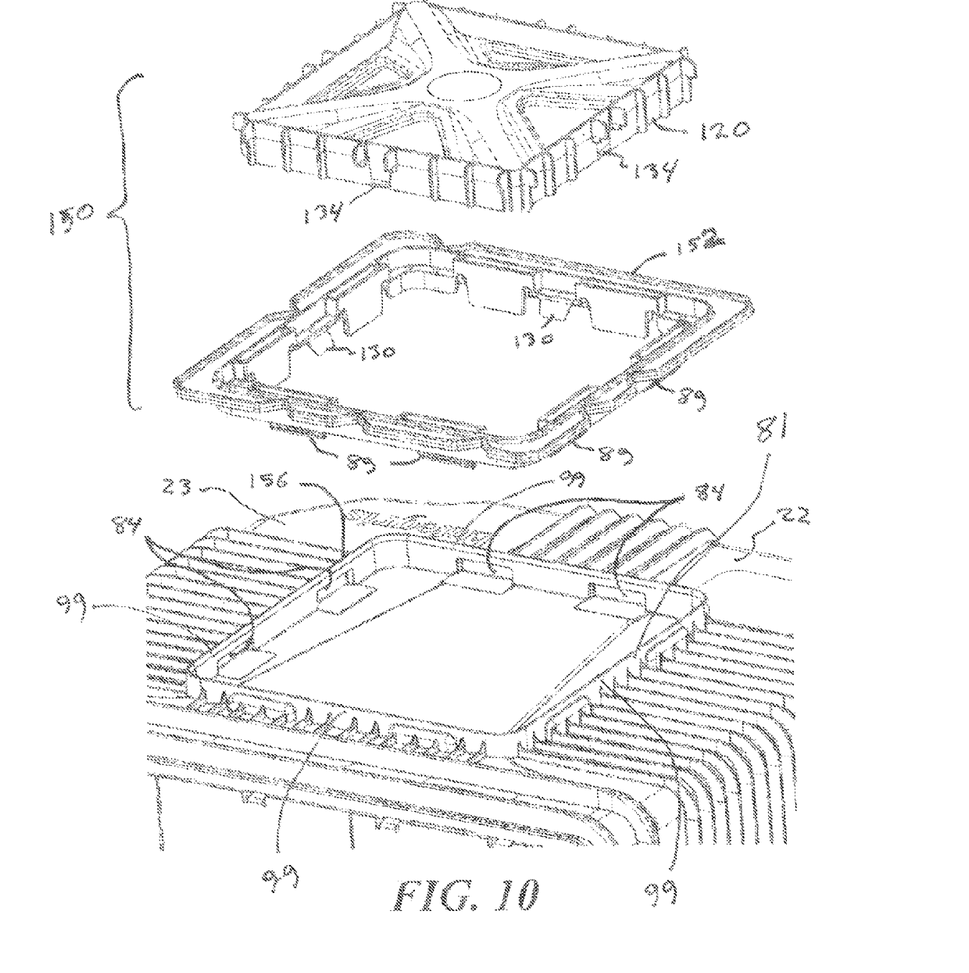
FIG. 10 is a further exploded view of the top of a front opening wafer container and a robotic flange assembly according to the invention herein.

In FIG. 10, a further exploded view of a robotic flange 150 is depicted in an embodiment of the invention. The robotic flange 150 is shown here to include a flange frame portion 152 and an internal portion or interlocking core 120. The internal portion 120 includes detents or catches 134 that engage with flexible tabs or spring members 130 on the interior of the frame portion 152 to secure the internal portion 120 into place. The frame portion 152 is mounted to a top port 156 defined on the top wall 23 of the container 22. More specifically, to the sides 99 of the upwardly extending flange 81. The frame portion 152 includes protrusions in the form of cantilevered snaps 89 that extend into the top port 156 with angled surfaces that cause the protrusions 89 to deflect inward as the frame portion 152 slides into the top port 156. Barbs or detents on the protrusions 89 clip into recesses or apertures 84 when the frame portion 152 is in place.

Figure 11:
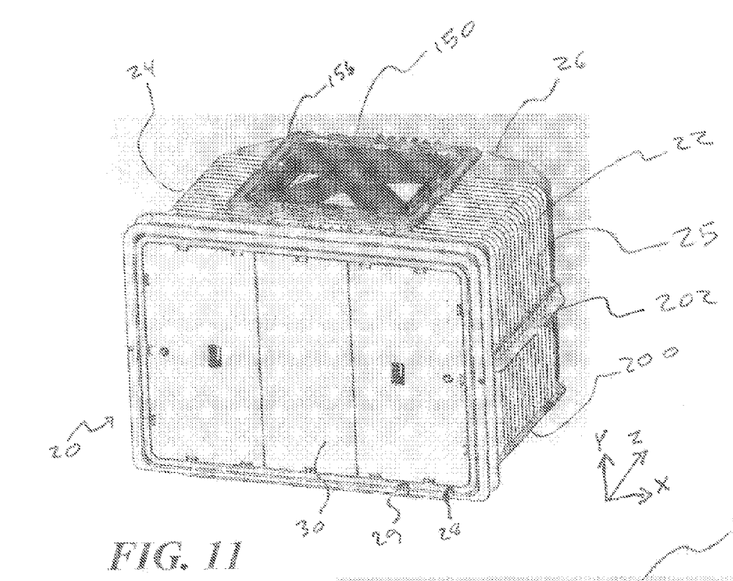
FIG. 11 is a perspective of a fully assembled front opening wafer container according to the invention.
Figure 12:
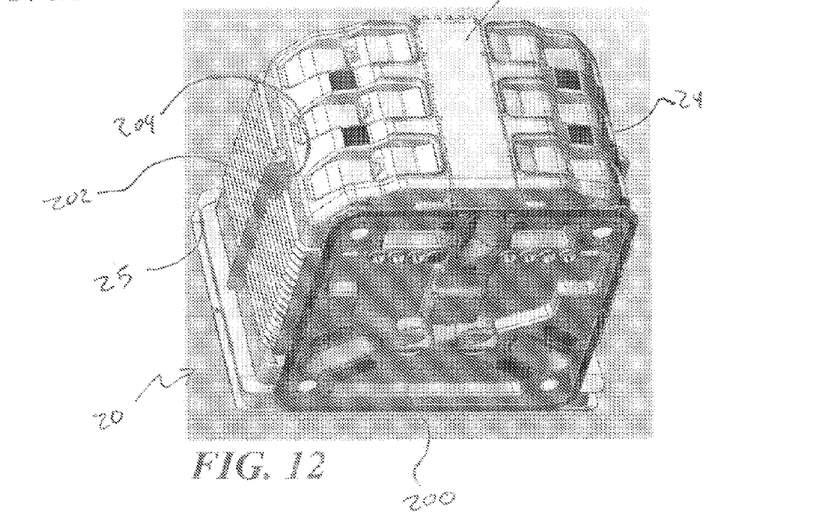
FIG. 12 is a perspective of a fully assembled front opening wafer container according to the invention.

FIGS. 11 and 12 depict a fully assembled wafer container 20, including the container portion 22, front door 30, and other features. Specifically, opposite perspective views are shown in which the fully assembled robotic flange 150 is depicted residing in the top port 156 on the top wall 23 of the container 22. Further, the front door 30 is shown in the door frame 28 of the front opening 29. At the bottom of the container 20 is a horizontally-disposed base plate 200 that is mounted proximate the bottom wall 27 of the housing on the exterior of the container 20. At each of the two sides of the container, are horizontally disposed conveyor rails 202. These conveyor rails are double horizontal conveyor rails which may be used by equipment, such as forklifts that may be used to manipulate the wafer containers. A set of short ribs 204 below the back portion of the conveyor rails 202 on either side of the container provide a lead in feature for automation entering from the backside of the carrier.

Figure 13:
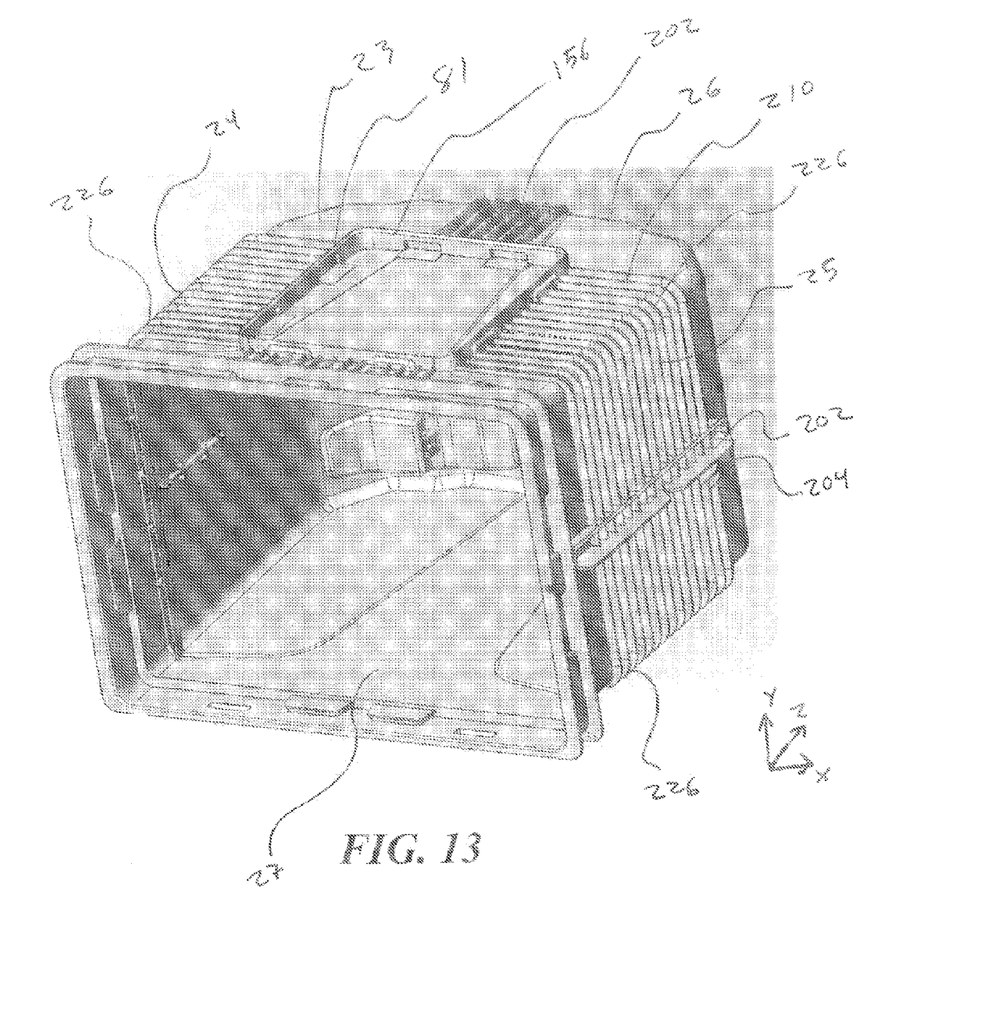
FIG. 13 is a perspective of a container portion of a front opening wafer container according to the invention.
Figure 14:
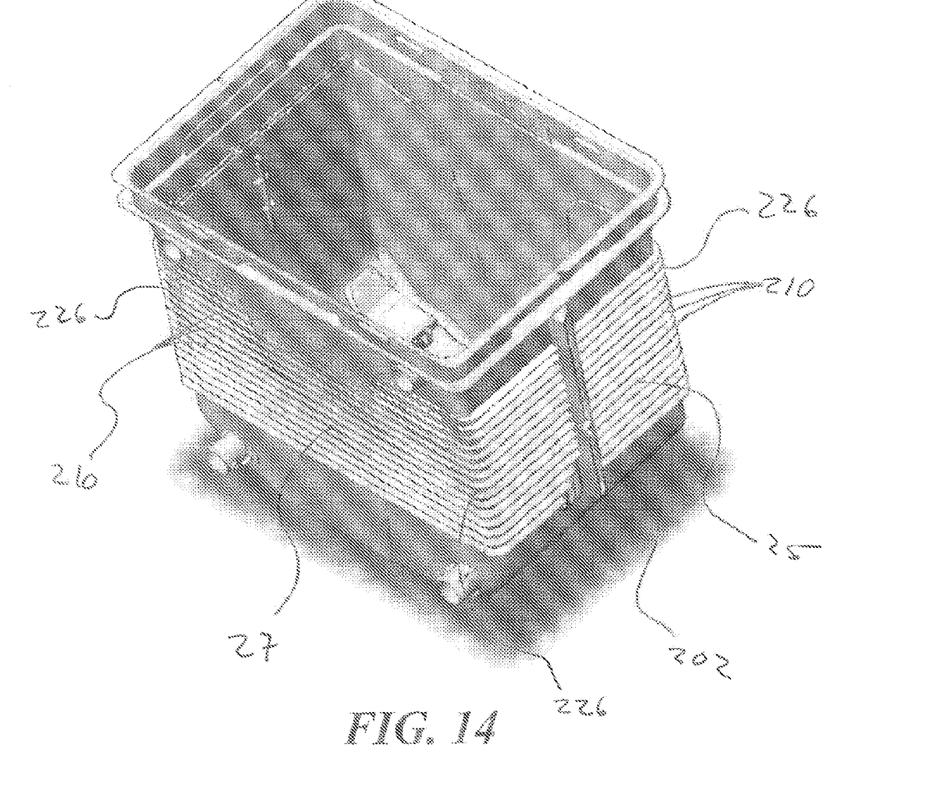
FIG. 14 is a perspective of a container portion of a front opening wafer container according to the invention.

FIGS. 13 and 14 depict top perspective and bottom perspective views of the container portion 22. As noted above, the container design is equipped with a rib design surrounding the container to minimize distortion. These ribs 210 are especially useful in minimizing distortion of the top wall 23 of the container during load carrying conditions. Such distortion may occur at either the forklift conveyor rails 202 or at the robotic flange 150.

As seen in these figures, a plurality of vertically-raised, spaced-apart, parallel rib members extend from two side walls of the engagement surfaces 110 all the way around the container 22 in a generally continuous fashion. This continuous path around the top wall, side walls, and bottom wall defines the full circumference or perimeter of the container 22. Although the double horizontal conveyor rails 202 cross the path of these ribs, the ribs continue through these features and should be considered uninterrupted. The conveyor rails 202 found on either sidewall, further provide some linear stiffness along the container length as well. The ribs 210 may extend in other directions from the flange and may be the same or different in terms of size and structure. Some embodiments may have more than 15 spaced apart ribs. Some embodiments may have between 10 and 15 spaced apart ribs. Some embodiments may have fewer than 10 spaced apart ribs. Some embodiments have 7 to 10 ribs. Further, some embodiments include evenly spaced ribs of 4 to 6 ribs on a side or 7 to 10 ribs on a side of the attachment flange 150. Ribs 210 may be of various sizes and dimensions. In some embodiments, the ribs 210 may be converging structures. For example, in some embodiments the ribs will have a width of 3.9 mm at the base and 2.2 mm at their tips. Accordingly, each of the ribs 210 will have an average thickness of between 3.9 and 2.2 mm.

The ribs 202 may generally extend upwardly and outwardly from the wall container and extend toward the right, left, front and back sidewalls of the container. The ribs 210 may preferably run transverse in the x direction across the bottom and top walls 23 and 27 of the container and may run vertically in the Y direction on the side walls 24 and 25. The ribs may have rounded corners 226 at each of the corners of the container 22.

Although spaced apart ribs, as shown, are one means for minimizing distortion in the loading condition, various other repeating rib or related pattern or structural members may be possible as well.

Figure 15:
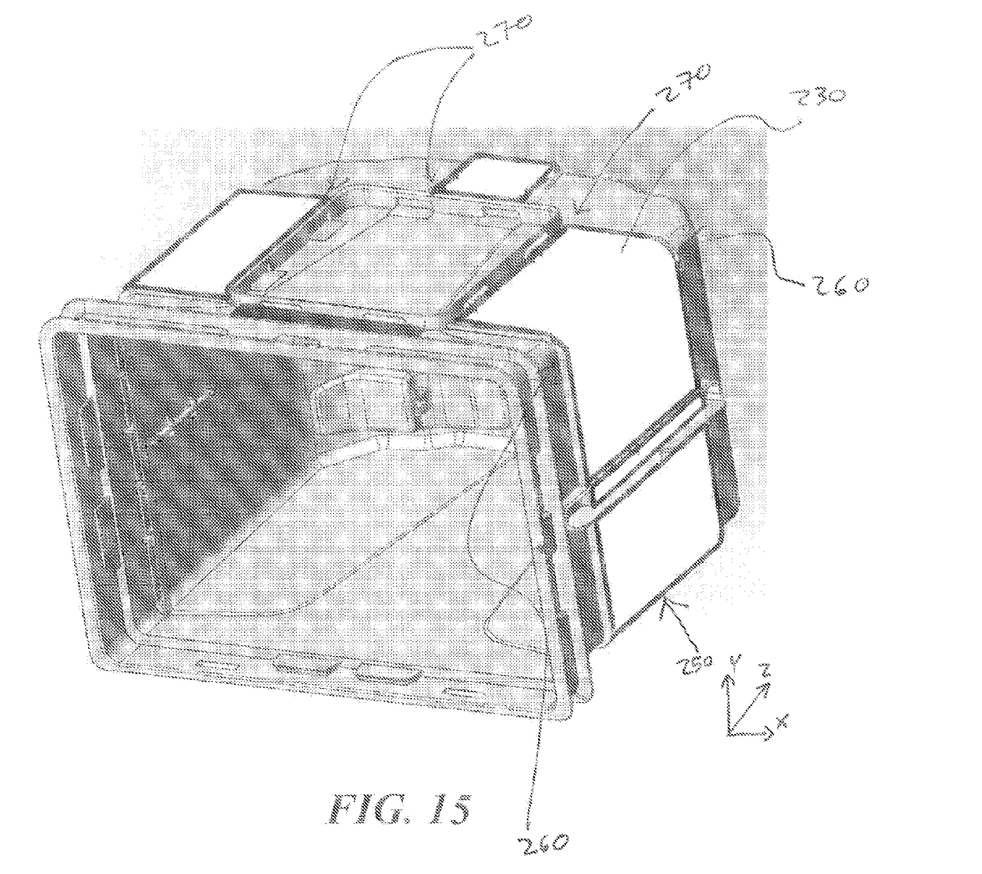
FIG. 15 is a perspective of a container portion of a front opening wafer container having a supplemental distortion minimization structure according to the invention.

FIG. 15 depicts a further alternative embodiment to the rib structure seen the previous figures. Specifically, the container 22 shown is surrounded by an exoskeleton 230 to minimize distortion under loading. This exoskeleton 230 may take on various shapes. For example, in some embodiments, the exoskeleton will comprise a secondary wall which extends like a saddle around the housing walls. This secondary set of walls may surround the top wall and side walls in some embodiments. In some embodiments, the secondary walls may surround the bottom surface of the container as well. In some embodiments the exoskeleton is integrally formed with the container portion. In other embodiments the exoskeleton may separately but closely coupled with the container walls. It is contemplated that the secondary walls of the exoskeleton may surround open and accessible central cavities to the outside environment, or alternatively be fully closed structures.

In some embodiments, the exoskeleton may be fixed integrally and continuously against the outside surfaces of the container 22. In other embodiments, the exoskeleton may only be fixed at locations 250 adjacent the bottom wall or at locations 260 at the corners of the container as well as locations 270 at the portion of the container adjacent the robotic flange 150. Alternatively, the exoskeleton may be attached at spaced apart locations along the perimeter of the exoskeleton.

It should also be appreciated that the exemplary embodiment or exemplary embodiments are only examples, and are not intended to limit the scope, applicability, or configuration of the invention in any way. Rather, the foregoing detailed description will provide those skilled in the art with an enabling disclosure for implementing the exemplary embodiment or exemplary embodiments. It should be understood that various changes can be made in the function and arrangement of elements without departing from the scope of the invention as set forth in the appended claims and the legal equivalents thereof.

The embodiments above are intended to be illustrative and not limiting. Additional embodiments are within the claims. Although the present invention has been described with reference to particular embodiments, workers skilled in the art will recognize that changes may be made in form and detail without departing from the spirit and scope of the invention.

Various modifications to the invention may be apparent to one of skill in the art upon reading this disclosure. For example, persons of ordinary skill in the relevant art will recognize that the various features described for the different embodiments of the invention can be suitably combined, un-combined, and re-combined with other features, alone, or in different combinations, within the spirit of the invention. Likewise, the various features described above should all be regarded as example embodiments, rather than limitations to the scope or spirit of the invention. Therefore, the above is not contemplated to limit the scope of the present invention.

What is claimed is:

1. A front opening wafer container, comprising:
a container portion having a top wall, bottom wall, right side wall, left side wall, rear wall and door frame defining a front opening;
an upwardly extending flange on the top wall having four sides for connection to an attachment flange, each of the four sides of the upwardly extending flange having at least one aperture defined therein;
an attachment flange operably attached to the upwardly extending flange;
wherein the attachment flange includes a frame portion having four sides, with each side having at least one detent mechanism having a downwardly extending deflectable portion and a nub portion, wherein the detent mechanism actuates to capture the attachment flange with a downward placement of the frame portion of the attachment flange to engage the upwardly extending flange and to deflect a the downwardly extending resilient deflectable portions of each the detent mechanisms horizontally from a retention position to a deflected position and wherein in the retention position, the nub portion of the downwardly extending deflectable portion is received in a corresponding aperture of the upwardly extending flange and wherein the attachment flange may be installed and removed.

2. The front opening wafer container of claim 1, further including an interlocking core piece for insertion and retention by the frame portion of the attachment flange for engaging and locking the plurality of downwardly extending resilient deflectable portions in their retention position.

3. The front opening wafer container of claim 1, further including four parallel ribs each integral with and extending from one of the sides of the upwardly extending flange, the four parallel ribs integral with the top wall and extending toward the left side wall and extending around a top corner between the left side wall and the top wall and vertically down the left side wall and being continuous from the upwardly extending flange and down the left side wall.

4. The front opening wafer container of claim 3, further including an additional four parallel ribs each integral with and extending from one of the sides of the upwardly extending flange, the additional four parallel ribs integral with the top wall and extending toward the right side wall and extending around a top corner between the right side wall and the top wall and vertically down the left side wall and being continuous from the upwardly extending flange and down the right side wall.

5. The front opening wafer container of claim 1, wherein the downwardly extending portion of the at least one detent mechanism of each side comprises a leaf spring.

6. The front opening wafer container of claim 1, wherein each nub portion comprises a wedge shaped surface.

7. The front opening wafer container of claim 5, wherein each leaf spring extends in an upward direction Y.

8. The front opening wafer container of claim 7, wherein the top wall generally extends in a direction X and a direction Z and the upward direction Y is orthogonal the direction X and the direction Y.

9. The front opening wafer container of claim 5, wherein each nub portion extends horizontally into the corresponding aperture.

10. The front opening wafer container of claim 1, wherein the top wall generally extends in a direction X and a direction Z and upwardly extending flange extends from the top wall in an upward direction Y that is orthogonal the direction X and the direction Y.

11. The front opening wafer container of claim 1, wherein the top wall generally extends in a direction X and a direction Z and upwardly extending flange comprises four sides that each extend from the top wall in an upward direction Y that is orthogonal the direction X and the direction Y.

12. A front opening wafer container, comprising:
a container portion having a top wall, a pair of sidewalls, a back wall, bottom wall and a door frame defining a front opening;
an upwardly extending flange on the top wall of the container portion; and
a removable robotic flange that attaches vertically, without separate fasteners, using detent mechanisms having resilient bending members that extend in a downward direction to attach to the upwardly extending flange on the top wall of the container portion, the removable robotic flange having a frame portion defining a recess;
wherein an interlocking core member received in the recess defined by the frame portion of robotic flange such that a side wall of the interlocking core contacts the resilient members to cause the resilient member to flex in an inward direction towards the upwardly extending flange to lock the resilient bending members in place.

13. The front opening wafer container of claim 12, wherein the top wall generally extends in a direction X and a direction Z and upwardly extending flange extends from the top wall in an upward direction Y that is orthogonal the direction X and the direction Y.

14. The front opening wafer container of claim 12, wherein the top wall generally extends in a direction X and a direction Z and upwardly extending flange comprises four sides that each extend from the top wall in an upward direction Y that is orthogonal the direction X and the direction Y.

15. The front opening wafer container of claim 14, wherein each resilient bending member comprises a leaf spring and a nub on the leaf spring.

16. The front opening wafer container of claim 14, wherein each nub comprises a wedge shaped surface.

17. The front opening wafer container of claim 14, wherein each nub is received in an aperture or recess defined by the upwardly extending flange.

18. The front opening wafer container of claim 14, wherein each leaf spring extends in an upward direction Y.

19. The front opening wafer container of claim 14, wherein each nub extends horizontally into an aperture or recess defined by the upwardly extending flange.

* * * * *